United States Patent
Inaba et al.

(10) Patent No.: US 6,265,760 B1
(45) Date of Patent: Jul. 24, 2001

(54) SEMICONDUCTOR DEVICE, AND SEMICONDUCTOR DEVICE WITH DIE PAD AND PROTRUDING CHIP LEAD FRAME AND METHOD OF MANUFACTURING THE SAME

(75) Inventors: Takehito Inaba; Michihiko Ichinose; Kenji Oyachi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/302,040

(22) Filed: Apr. 29, 1999

(30) Foreign Application Priority Data

May 1, 1998 (JP) .................................................. 10-122054

(51) Int. Cl.⁷ ..................... H01L 23/50; H01L 25/065; H01L 23/52; H01L 21/56
(52) U.S. Cl. ..................... 257/666; 257/686; 257/723; 257/730; 257/777; 257/676; 257/783; 257/685; 257/784; 257/724
(58) Field of Search ..................... 257/666, 684, 257/686, 723, 730, 676, 668, 724, 783, 782, 685, 784, 777

(56) References Cited

U.S. PATENT DOCUMENTS

| | | | | |
|---|---|---|---|---|
| 5,012,323 | * | 4/1991 | Farnworth ............................ | 361/421 |
| 5,299,092 | * | 3/1994 | Yaguchi et al. ..................... | 361/728 |
| 5,471,369 | * | 11/1995 | Honda et al. ........................ | 361/813 |
| 5,502,289 | * | 3/1996 | Takiar et al. ......................... | 174/266 |
| 5,523,608 | * | 6/1996 | Kitaoka et al. ...................... | 257/433 |
| 5,545,922 | * | 8/1996 | Golwalkar et al. .................. | 257/676 |
| 5,615,475 | * | 4/1997 | Burns .................................... | 29/827 |
| 5,640,044 | * | 6/1997 | Takehashi et al. ................... | 257/666 |
| 5,646,829 | * | 7/1997 | Sota ...................................... | 361/813 |
| 5,677,569 | * | 10/1997 | Choi et al. ........................... | 257/686 |
| 5,724,233 | * | 3/1998 | Honda et al. ........................ | 361/813 |
| 5,757,080 | * | 5/1998 | Sota ...................................... | 257/777 |
| 5,793,101 | * | 8/1998 | Kuhn .................................... | 257/676 |
| 5,793,108 | * | 8/1998 | Nakanishi et al. ................... | 257/723 |
| 5,814,881 | * | 9/1998 | Alagaratnam et al. .............. | 257/686 |
| 5,898,220 | * | 4/1999 | Ball ....................................... | 257/723 |
| 6,072,243 | * | 6/2000 | Nakanishi ............................ | 257/783 |
| 6,104,084 | * | 8/2000 | Ishio et al. ........................... | 257/666 |
| 6,118,184 | * | 9/2000 | Ishio et al. ........................... | 257/787 |

FOREIGN PATENT DOCUMENTS

| | | |
|---|---|---|
| 4-179264 | 6/1992 | (JP) . |
| 5-283601 | 10/1993 | (JP) . |
| 9-27587 | 1/1997 | (JP) . |
| 9-36300 | 2/1997 | (JP) . |
| 9-181249 | 7/1997 | (JP) . |
| 9-252072 | 9/1997 | (JP) . |

* cited by examiner

*Primary Examiner*—Alexander O. Williams
(74) *Attorney, Agent, or Firm*—Helfgott & Karas, P.C.

(57) ABSTRACT

In a semiconductor device, semiconductor chips are mounted on two surfaces of a die pad. A lower one of the semiconductor chips has a portion projecting outward from an upper one of the semiconductor chips. The semiconductor chips are connected to integrally molded external connection leads trough wiring members. The lower semiconductor chipping the outwardly projecting portion has, on its surface on the same side as an upper surface of the upper semiconductor chip, pads to be connected to the external connection leads. A semiconductor device lead frame and a method of manufacturing the same are also disclosed.

10 Claims, 8 Drawing Sheets

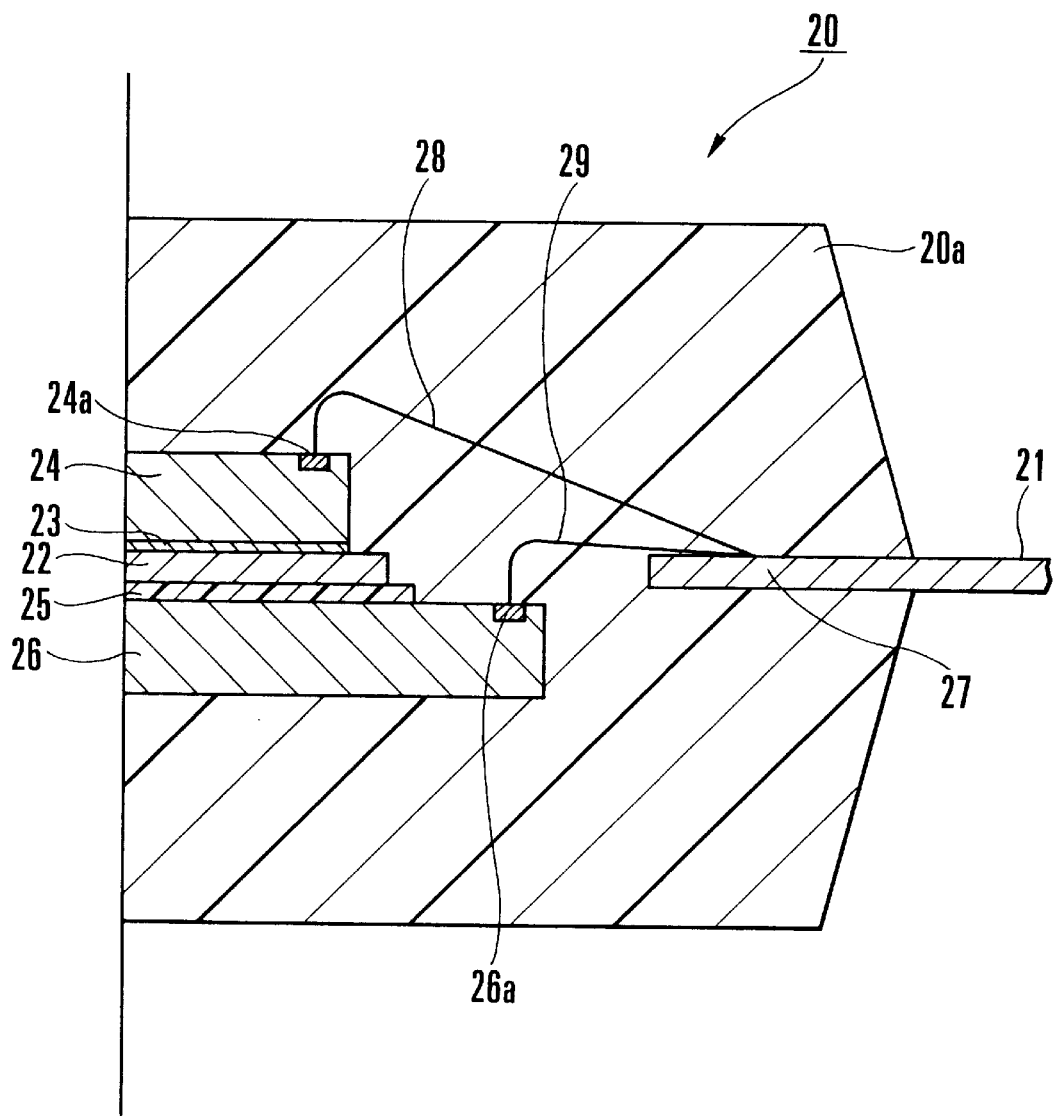
F I G. 1

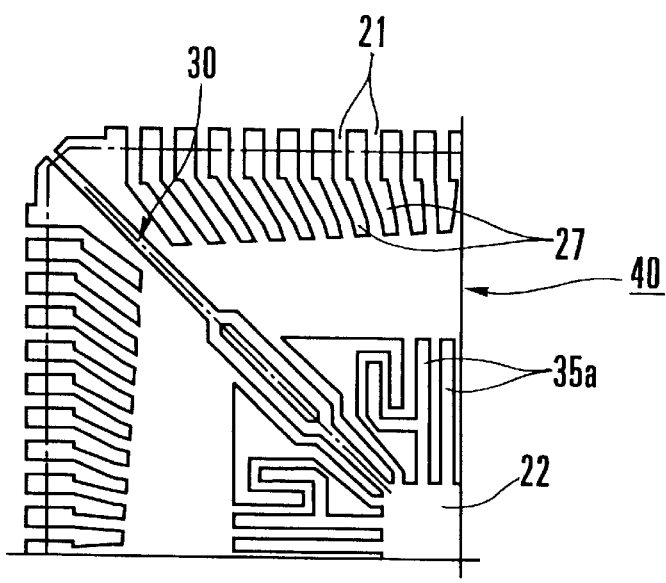
F I G. 6 A
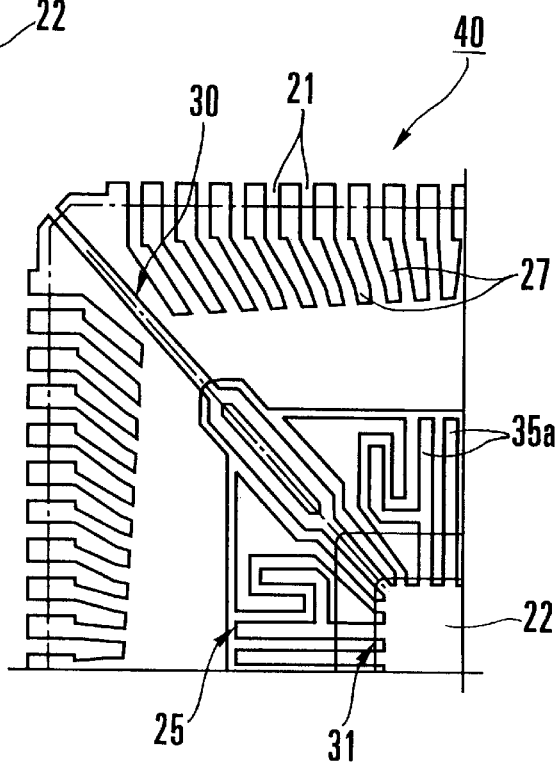
F I G. 6 B
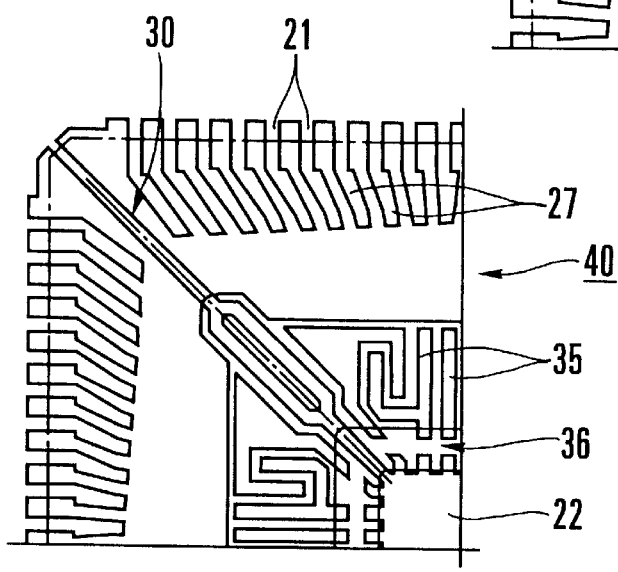
F I G. 6 C

US 6,265,760 B1

SEMICONDUCTOR DEVICE, AND SEMICONDUCTOR DEVICE WITH DIE PAD AND PROTRUDING CHIP LEAD FRAME AND METHOD OF MANUFACTURING THE SAME

BACKGROUND OF THE INVENTION

The present invention relates to a chip stack type semiconductor device in which a plurality of semiconductor chips are mounted on a lead frame by the high-degree integration technique, and a semiconductor device lead frame and a method of manufacturing the same.

For example, a chip stack type semiconductor device of this type is used when logic cells and memory cells are to be mounted to form a hybrid circuit, when a memory capacity is to be increased, and when a plurality of semiconductors having different manufacturing processes and materials are to be mounted.

A structure conventionally known as a chip stack type semiconductor device of this type will be described with reference to FIG. 8. In this conventional semiconductor device 1, first and second semiconductor chips 3 and 4 are respectively adhered to the upper and lower surfaces of a die pad 2 of a lead frame L/F with conductive adhesive portions 5a and 5b of a silver paste or the like. Bonding wires 7 and 8 for respectively connecting the chips 3 and 4 to inner leads 6 of the lead frame L/F are connected to the upper and lower surfaces, respectively, of the inner leads 6. A resin-encapsulated package 9 encapsulates the chips 3 and 4 stacked on and adhered to the die pad 2, the inner leads 6 of the lead frame, and the bonding wires 7 and 8.

This conventional semiconductor device is manufactured in accordance with the following manufacturing method.

The conductive adhesive portion 5a of a silver paste or the like is formed on the surface of the die pad 2 of the lead frame L/F, and the first chip 3 is mounted on it. The lead frame L/F mounted with the first chip 3 is turned back. The conductive adhesive portion 5b of a silver paste or the like is formed on the lower surface of the die pad 2, and the second chip 4 is mounted on it. The resultant structure is baked.

The second chip 4 and the lower surfaces of the inner leads 6 are connected to each other by bonding with the bonding wires 8. After that, the lead frame L/F is turned over. The first chip 3 and the upper surfaces of the inner leads 6 are connected to each other by bonding with the bonding wires 7. After that, resin encapsulation and following operation are performed. An explanation of resin encapsulation and the following operation will be omitted.

FIG. 9 shows a case wherein a semiconductor device 1 uses a TAB tape 10. In FIG. 9, the TAB tape 10 is adhered to a portion of the surface of a die pad 2, extending laterally from a first chip 3, through an adhesive 11.

Metal wires 12 on the surface of the TAB tape 10 and the first chip 3 are connected to each other by bonding with bonding wires 7. The metal wires 12 of the TAB tape 10 are also connected to inner leads 6 by bonding with bonding wires 13.

Even in the semiconductor device 1 having this structure, the first chip 3 and a second chip 4 on the upper and lower surfaces, respectively, of the die pad 2 are connected to the inner leads 6 from both the upper and lower sides by turning a lead frame L/F over during the manufacture.

In the semiconductor device 1 having the conventional structure described above, as shown in FIGS. 8 and 9, to connect the first chip 3 by bonding, the second chip 4 must be connected by bonding, then the lead frame L/F must be turned over, and after that, the first chip 3 must be connected by bonding. As the bonding step must be performed twice during the manufacturing process, the number of manufacturing steps and accordingly the cost are increased.

After bonding connection of the second chip 4 is completed, the lead frame L/F is turned over to connect the first chip 3 by bonding. Therefore, the bonding wires 7, 8, and 13 tend to deform easily during the manufacture. The semiconductor device 1 thus must be handled carefully, and the yield in the manufacture decreases. As described above, the manufacture requires turning the lead frame over and performing connection by bonding on the two surfaces of the lead frame. A conventionally used manufacturing apparatus cannot be used directly, but a special apparatus is needed.

In the structure shown in FIG. 9, the TAB tape 10 is used as an interconnection in a resin-encapsulated package 9 for connecting the first and second chips 3 and 4. This increases the cost of the lead frame L/F.

For example, Japanese Patent Laid-Open No. 3-116860 discloses a chip stack type semiconductor device. In this semiconductor device, insulating adhesive tapes are adhered to both the upper and lower surfaces of a lead frame, and first and second chips having different sizes are placed on the upper and lower surfaces of the lead frame. The chips and the inner leads of the lead frame are connected to each other by wire bonding.

In the semiconductor device disclosed in this reference, when the respective chips are mounted on the upper and lower surfaces of the lead frame through insulating adhesive films, two expensive insulating adhesive films are required to increase the material cost. In this conventional structure, when the chips are mounted on the upper and lower surfaces of the lead frame through the insulating adhesive films, the thickness of the package is difficult to decrease in the presence of the two insulating adhesive films.

Japanese Patent Laid-Open No. 7-38050 discloses a semiconductor device manufactured by using an LOC (Lead On Chip)-structure lead frame having isolated inner leads for internal interconnection.

As shown in this reference, it is technically difficult to cut outwardly extending inner leads and insulating tapes simultaneously. In the lead frame used in this conventional structure, the insulating tapes to which the isolated inner leads for internal interconnection are adhered are supported by the outwardly extending inner leads. Therefore, design of the inner leads for internal interconnection is limited due to the space.

SUMMARY OF THE INVENTION

The present invention has been made in view of the above situation, and has as its object to provide a semiconductor device in which, when semiconductor chips having different sizes are to be mounted on the die pad of a lead frame and the respective chips are to be connected to the inner leads of the lead frame by using bonding wires, the number of manufacturing steps is reduced, the manufacturing operability is improved, and the manufacturing cost is reduced, and a semiconductor device lead frame and a method of manufacturing the same.

In order to achieve the above object, according to the present invention, there is provided a semiconductor device in which semiconductor chips are mounted on two surfaces of a die pad, a lower one of the semiconductor chips having a portion projecting outward from an upper one of the semiconductor chips, and the semiconductor chips being connected to integrally molded external connection leads through wiring members, wherein the lower semiconductor chip having the outwardly projecting portion has, on a surface thereof on the same side as an upper surface of the upper semiconductor chip, pads to be connected to the external connection leads.

BRIEF DESCRIPTION OF THE DRAWINGS

FIG. 1 is a sectional view of a semiconductor device and a semiconductor device lead frame and a method of manufacturing the same according to the first embodiment of the present invention;

FIGS. 6A to 6C are plan views of the semiconductor device and the semiconductor device lead frame and the method of manufacturing the same according to the third embodiment of the present invention;

DESCRIPTION OF THE PREFERRED EMBODIMENTS

Figure 2:
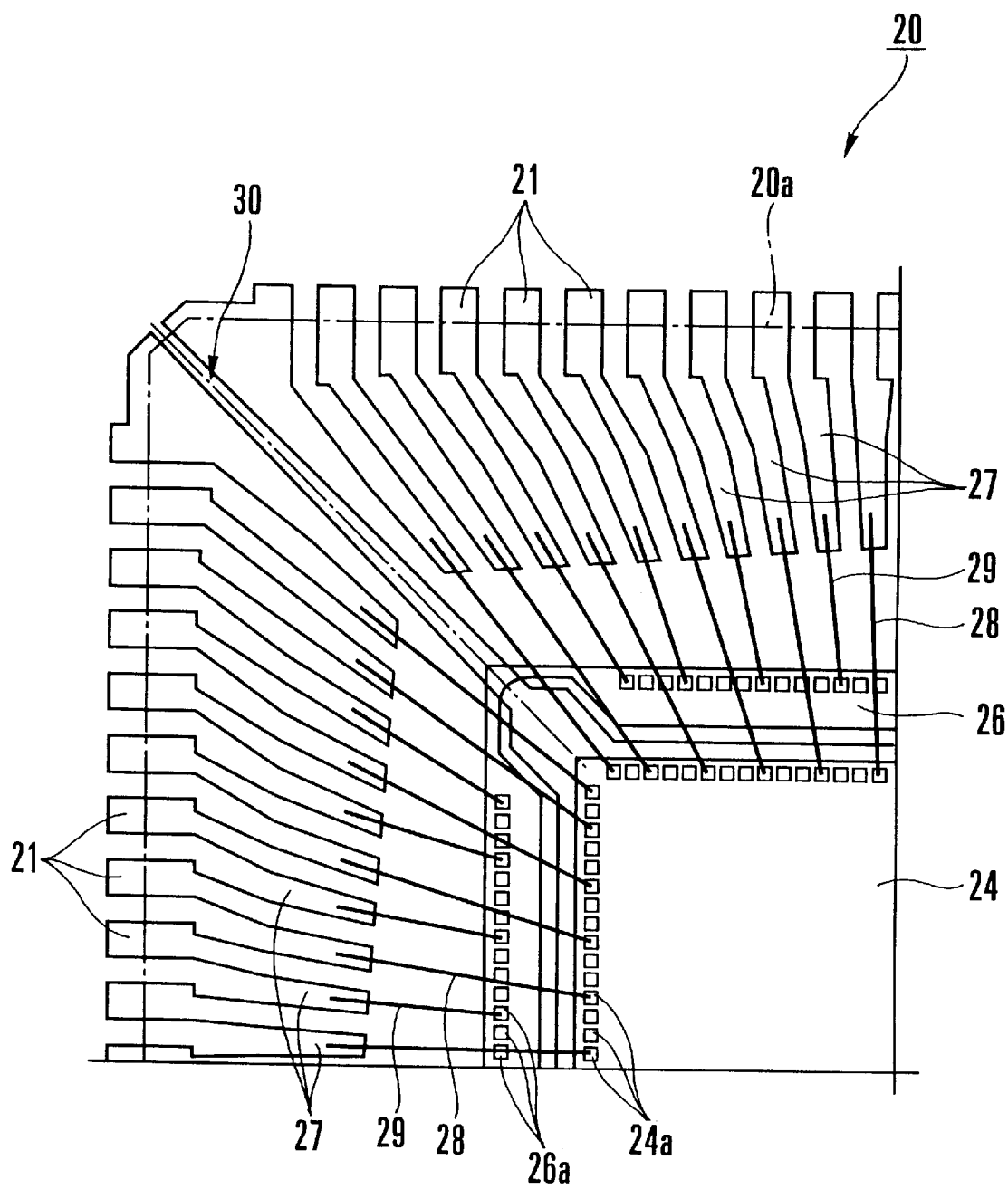
FIG. 2 is a plan view of the semiconductor device and the semiconductor device lead frame and the method of manufacturing the same according to the first embodiment of the present invention.

FIGS. 1 and 2 show a semiconductor device and a semiconductor device lead frame and a method of manufacturing the same according to the first embodiment of the present invention.

Referring to FIGS. 1 and 2, reference numeral 20 denotes a chip stack type semiconductor device. In the semiconductor device 20, a first semiconductor chip 24 is fixed to the upper surface of a die pad 22 of a lead frame 21 by adhesion through a conductive adhesive 23 such as a silver paste, and a second semiconductor chip 26 is fixed to the lower surface of the die pad 22 by adhesion through an adhesive tape 25 such as an LOC tape.

The first and second chips 24 and 26 have different chip sizes, and the second chip 26 is larger than the first chip 24. Pads 24a and 26a are formed on the upper surface of the first chip 24 and the upper surface of the second chip 26 (a surface on a side where the second chip 26 is fixed to the die pad 22 by adhesion and which extends laterally from the first chip 24), respectively, to connect the first and second chips 24 and 26 to inner leads 27 of the lead frame 21 through bonding wires 28 and 29.

Although not shown, the first and second chips 24 and 26 may be electrically connected to each other by connecting the pads 24a on the first chip 24 and the pads 26a on the second chip 26 to each other by bonding directly through bonding wires.

In FIG. 1, a resin-encapsulated package 20a encapsulates the chips 24 and 26, the inner leads 27, and the like described above, and a hanging pin 30 supports the die pad 22.

A method of manufacturing the semiconductor device 20 having the above arrangement will be described.

The lead frame 21, in which the adhesive tape 25 such as the LOC tape is adhered to the lower surface of the die pad 22, is prepared. The second chip 26 is thermally bonded to the lower surface of the die pad 22 and fixed to the die pad 22 by adhesion.

The conductive adhesive 23 such as a silver paste is applied to the upper surface of the die pad 22. The first chip 24 is mounted on and adhered to the conductive adhesive 23. The resultant structure is baked.

After that, the upper surface of the first chip 24 and the upper surface of the second chip 26 are connected to the upper surfaces of the inner leads 27 by bonding with the bonding wires 28 and 29. The entire structure is subjected to resin encapsulation and following operation. Resin encapsulation and the following operation are performed in the same manner as in the conventional manufacturing method, and a description thereof will be omitted.

According to the semiconductor device 20 having this arrangement, the first and second chips 24 and 26 can be fixed to the die pad 22 and the pads of the chips 24 and 26 are connected to the inner leads 27 by bonding with the bonding wires 28 and 29 from the upper side of the device simultaneously, or without turning the device over. Accordingly, unlike in the conventional method, a complicated, cumbersome operation of turning the lead frame over twice during the manufacture in order to fix the first and second chips to the die pad by adhesion and to connect the chips and the inner leads by bonding is not necessary.

Figure 3:
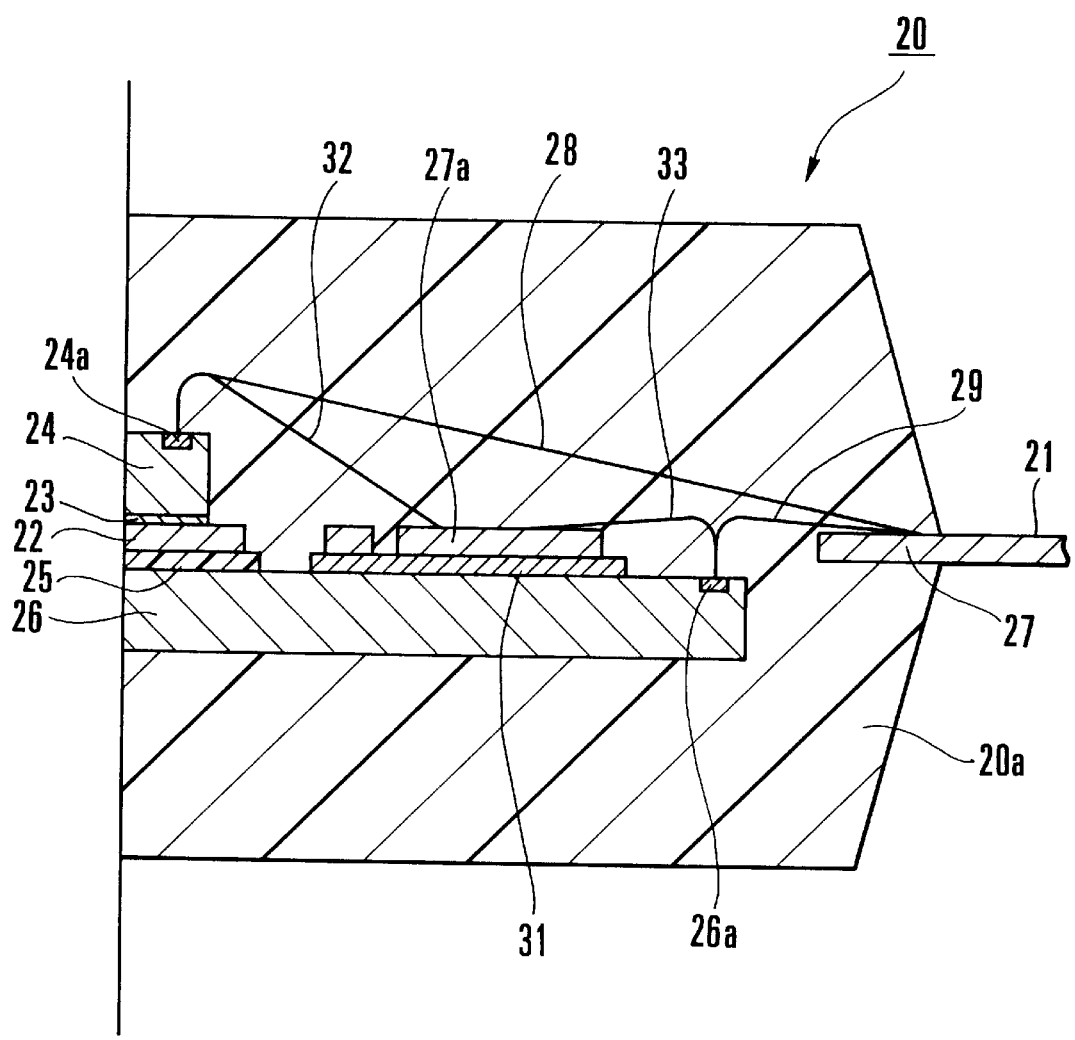
FIG. 3 is a sectional view of a semiconductor device and a semiconductor device lead frame and a method of manufacturing the same according to the second embodiment of the present invention.
Figure 4:
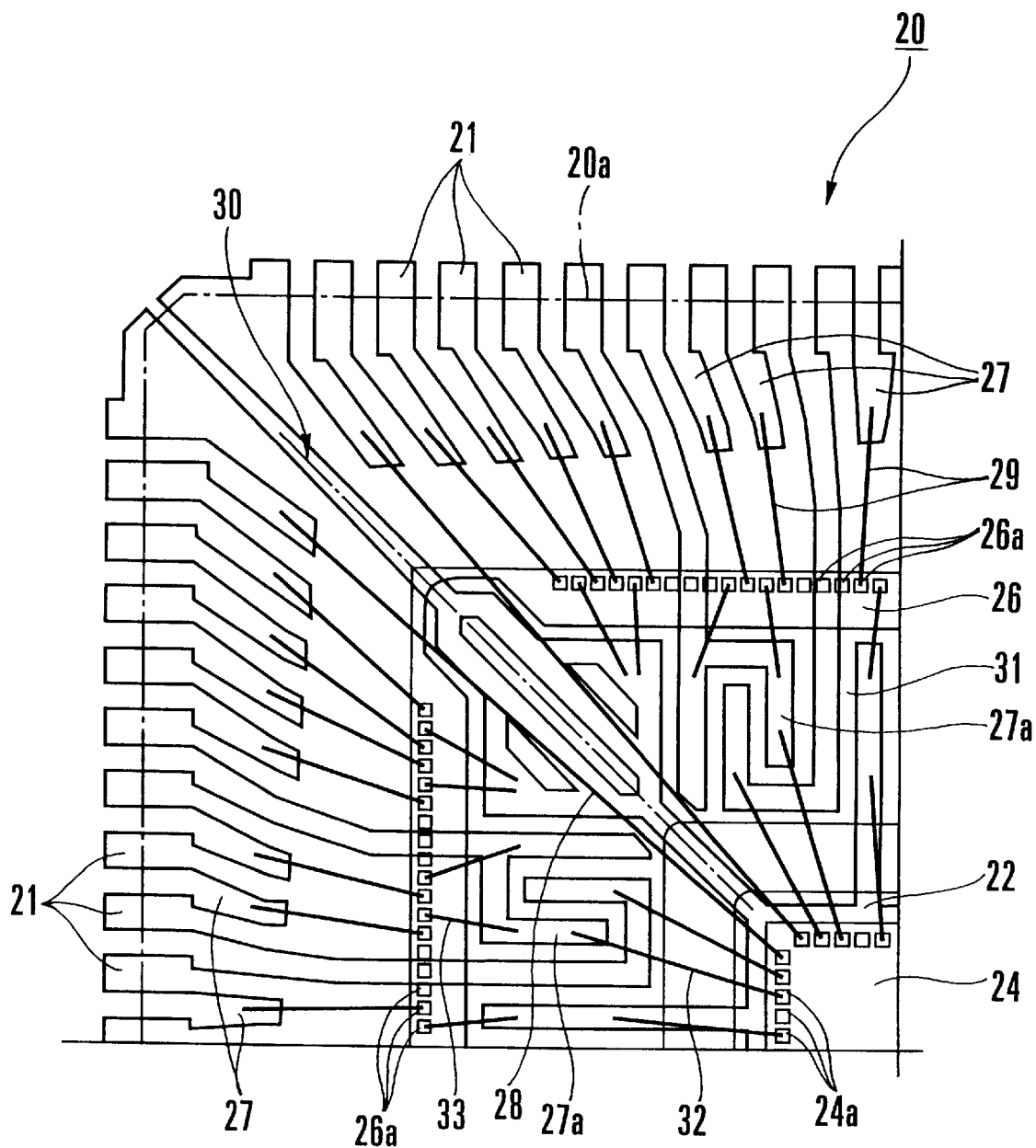
FIG. 4 is a plan view of the semiconductor device and the semiconductor device lead frame and the method of manufacturing the same according to the second embodiment of the present invention.

FIGS. 3 and 4 show the second embodiment of the present invention. In FIGS. 3 and 4, portions identical or corresponding to their counterparts in FIGS. 1 and 2 described above are denoted by the same reference numerals as in FIGS. 1 and 2, and a detailed description thereof will be omitted.

In the second embodiment, LOC lead portions 27a of inner leads 27 are adhered to the upper surface portion of a second chip 26, extending laterally from a first chip 24, through adhesive tapes 31 such as LOC tapes, thus forming an interconnection in a package 20a.

Referring to FIGS. 3 and 4, bonding wires 32 connect the first chip 24 and the LOC lead portions 27a to each other, and bonding wires 33 connect the LOC lead portions 27a and the inner leads 27 to each other. In the second embodiment, the die pad 22 is slightly larger than the first chip 24.

The first and second chips 24 and 26 may be electrically connected to each other by connecting pads 24a on the first chip 24 described above and pads 26a on the chip 26 directly by bonding.

A method of manufacturing the semiconductor device 20 described above according to the second embodiment of the present invention will be described.

A lead frame is prepared in the following manner. An adhesive tape 25 and the adhesive tapes 31 such as LOC tapes are adhered to the lower surface of a die pad 22 and the lower surfaces of the inner leads (LOC lead portions 27a), that form the LOC structure portion. The second chip 26 is thermally bonded to the lower surfaces of the die pad 22 and LOC lead portions 27a, thereby fixing it.

A conductive adhesive 23 such as a silver paste is applied to the upper surface of the die pad 22. The first chip 24 is adhered to the conductive adhesive 23. The resultant structure is baked.

After that, the first and second chips 24 and 26, the inner leads 27, and the LOC lead portions 27a are connected to each other by bonding, and operation following bonding is performed. A description of the operation following bonding will be omitted.

According to a semiconductor device 20 having this structure and the method of manufacturing the same, since the upper surface of the second chip 26 has an LOC structure, the interconnection in the package 20a to connect the first and second chips 24 and 26 to each other can be formed without using a TAB tape.

Figure 5:
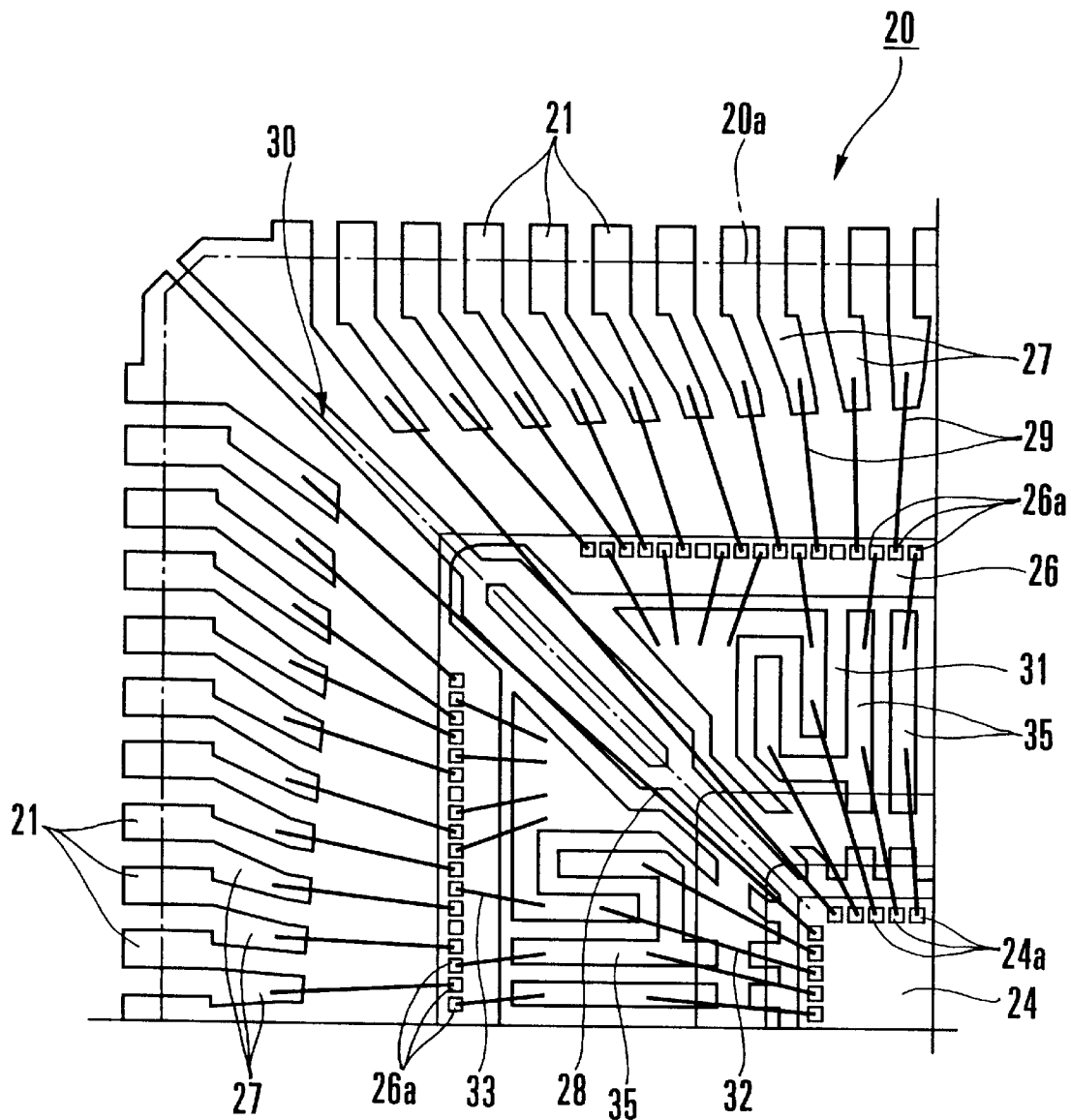
FIG. 5 is a plan view of a semiconductor device and a semiconductor device lead frame and a method of manufacturing the same according to the third embodiment of the present invention.

FIG. 5 shows a semiconductor device according to the third embodiment of the present invention. In FIG. 5, portions identical or corresponding to their counterparts in FIG. 4 described above are denoted by the same reference numerals as in FIG. 4, and a detailed description thereof will be omitted.

In the third embodiment, independent inner leads 35 for internal interconnection of the package are adhered to the upper surface of a second chip 26 through adhesive tapes 31 such as LOC tapes, to form an interconnection in a package 20a.

The first and second chips 24 and 26 may be electrically connected to each other by connecting pads 24a on a first chip 24 and pads 26a on the second chip 26 directly by bonding.

According to the third embodiment, the interconnection in the package 20a completely independent of the external leads can be formed. As compared to the structure of the second embodiment described above, inner leads 27 need not be extended onto the second chip 26 in order to form an LOC portion. There are no pads which cannot be connected by bonding due to the fact that the inner leads 27 extend to pass above the upper surface portions of the pads 26a of the second chip 26. Therefore, the degree of freedom in design can be widened.

A method of manufacturing the semiconductor device 20 described above according to the third embodiment will be described above.

A lead frame is prepared in the following manner. An adhesive tape 25 such as an LOC tape is adhered to the lower surface of the die pad 22, and adhesive tapes 25 such as LOC tapes, adhered with the independent inner leads 35 for interconnection in the package at the peripheral portion of a die pad 22, are held with hanging pins 30.

The second chip 26 is thermally bonded to the lower surface of the die pad 22. A conductive adhesive 23 such as a silver paste is applied to the upper surface of the die pad 22, and the first chip 24 is adhered to the conductive adhesive 23. The resultant structure is baked.

Operation following bonding is performed. The operation following bonding is the same as that described above which is conventionally, widely known, and accordingly a description thereof will be omitted.

A method of manufacturing a semiconductor device lead frame used in the third embodiment will be described with reference to FIGS. 6A, 6B, and 6C.

First, operation is performed until interior plating (silver plating) and cutting the distal ends of leads in accordance with the same steps as those performed for forming an ordinary lead frame.

At this time point, the inner leads 35 for interconnection in the package are connected to the die pad 22, and are formed as tab portions 35a extending from the die pad 22, as shown in FIG. 6A.

The adhesive tapes 25 and 31 such as LOC tapes are adhered to the lower surface of the die pad 22 and the lower surfaces of the tab portions 35a extending from the die pad 22, as shown in FIG. 6B.

At this time, the distance between the adhesive tape 25 adhered to the lower surface of the die pad 22 and the adhesive tapes 31 adhered to the lower surfaces of the tab portions 35a extending from the die pad 22 is preferably set to at least 1 mm or more considering the amounts of the tab portions 35a left after cutting.

The peripheral portion of the die pad 22 excluding the hanging pins 30 is cut to separate the tab portions 35a and die pad 22 from each other, thus forming the independent inner leads 35 for interconnection in the package. In FIG. 6C, reference numeral 36 denotes a portion where the tab portions 35a and die pad 22 are separated from each other.

Since the adhesive tapes 31 that adhere the inner leads 35 for interconnection in the package also adhere the hanging pins 30, the tapes 31 are supported by the hanging pins 30. Thus, the respective inner leads 35 for interconnection in the package become independent of each other, and can maintain the shape as a lead frame 40 even if they do not extend outside the package.

It is confirmed from experiments that, if the semiconductor device 20 is one having a general size, the width of a portion of each hanging pin that overlaps the second chip 26 is preferably at least 0.6 mm or more.

Figure 7:
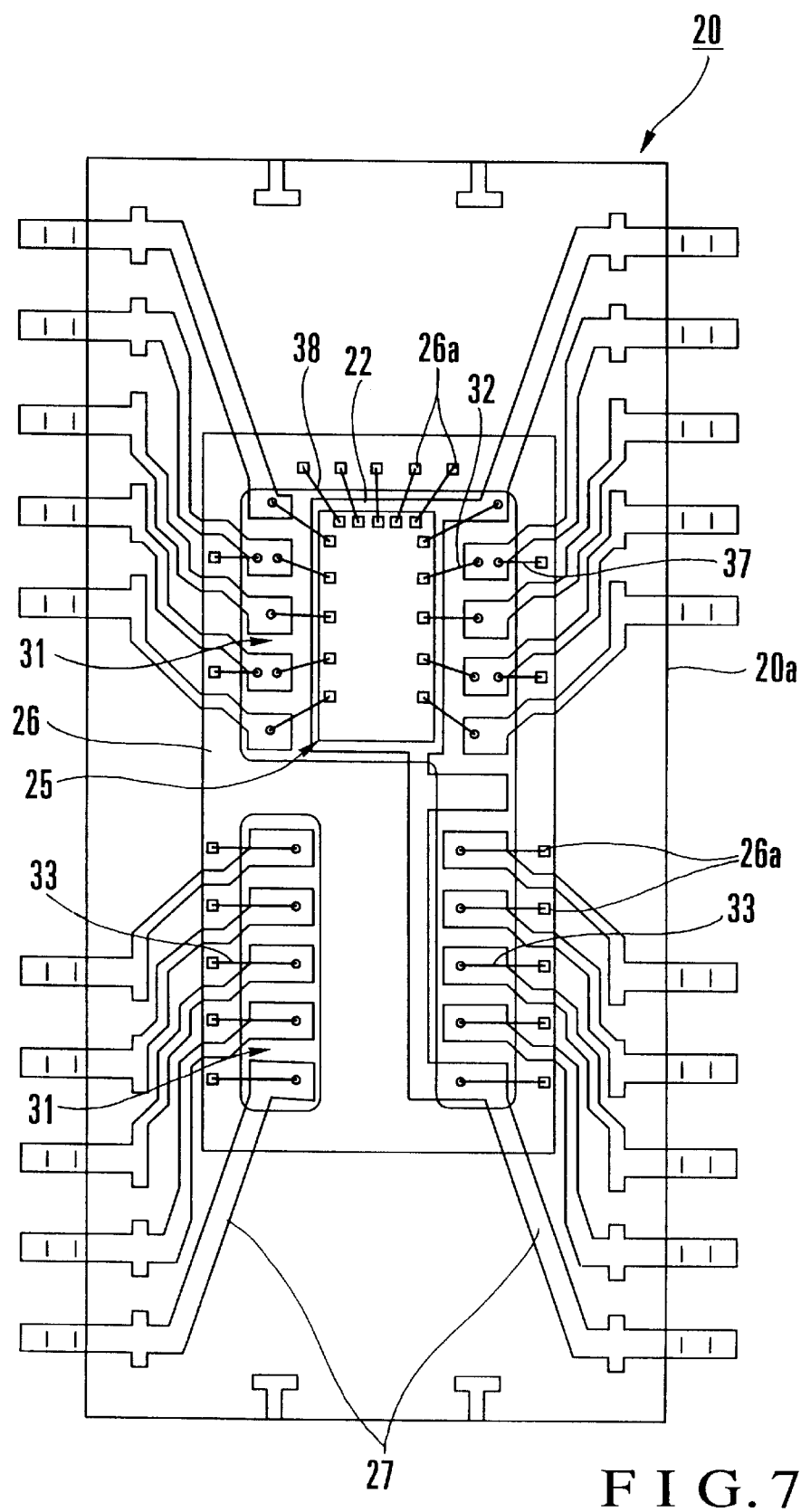
FIG. 7 is a plan view of a semiconductor device and a semiconductor device lead frame and a method of manufacturing the same according to the fourth embodiment of the present invention.
Figure 8:
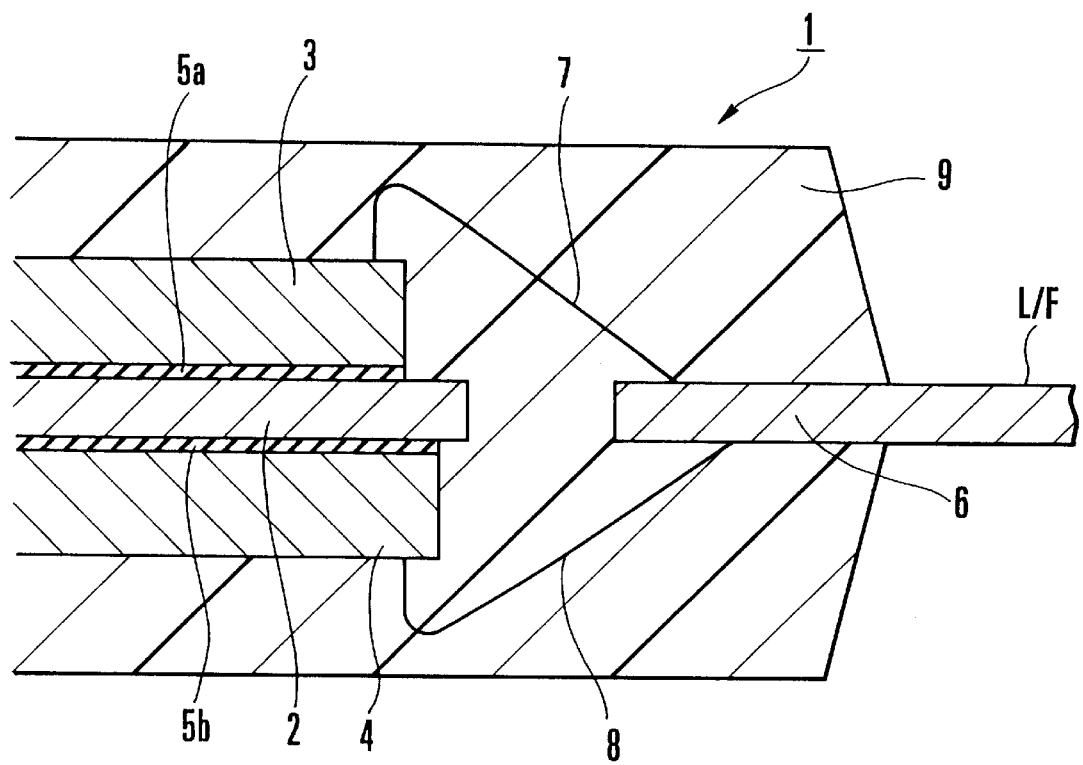
FIG. 8 is a sectional view of a conventional semiconductor device.
Figure 9:
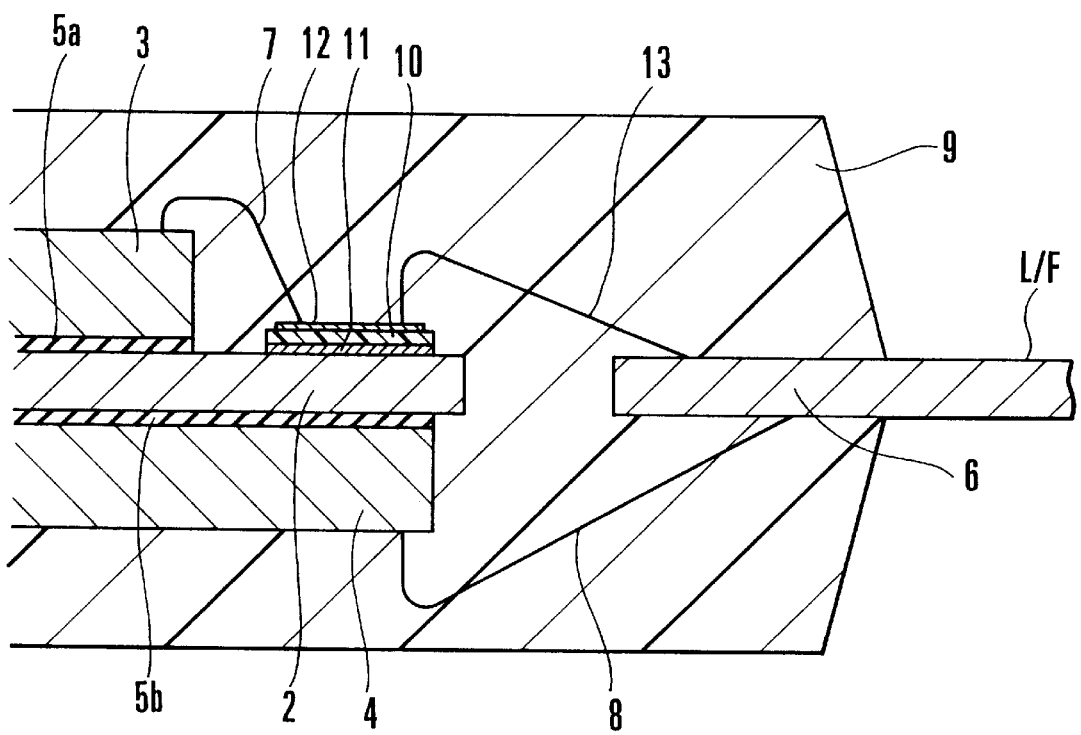
FIG. 9 is a sectional view showing another example of a conventional semiconductor device.

FIG. 7 shows a semiconductor device according to the fourth embodiment of the present invention, which will be described hereinafter.

A semiconductor device 20 according to the fourth embodiment has a package 20a having a following structure (LOC structure). That is, a second chip 26 is adhered to the lower surface of a lead frame through adhesive tapes 31 such as LOC tapes adhered to the lower surfaces of inner leads 27. In this package 20a, part (an inner end portion) of each inner lead 27 is formed to have a square or rectangular shape. A first chip 24 is adhered to the upper surfaces of these square or rectangular portions (inner leads 27) through a conductive adhesive 23 such as a silver paste.

Referring to FIG. 7, bonding wires 37 and 38 respectively connect the inner ends of the inner leads 27 and pads 26a of the second chip 26 to each other, and pads 24a of the first chip 24 and the pads 26a of the second chip 26 to each other.

A method of manufacturing the semiconductor device 20 according to the fourth embodiment will be described.

A lead frame is prepared in the following manner. Inner leads 27 are formed to partly have square or rectangular shapes, and an adhesive tape 25 and the adhesive tapes 31 such as LOC tapes are adhered to the lower surfaces of the square or rectangular portions partly formed at least on the inner leads 27, and to the lower surfaces of the bonding portions of the inner leads 27.

The second chip 26 is thermally bonded to the lower surface of the lead frame through the adhesive tapes 25 and 31 such as the LOC tapes. The conductive adhesive 23 such as a silver paste is applied to the upper surfaces of the square or rectangular portions formed on the inner leads 27, and the first chip 24 is adhered. The resultant structure is baked.

After that, operation following bonding is performed. A description on the operation following bonding will be omitted.

With the semiconductor device 20 and the method of manufacturing the same according to the embodiments described above, the surface of the second chip 26 is adhered through the adhesive tape 25 such as the LOC tape adhered to the lower surface of the die pad 22. The first and second chips 24 and 26 can be connected by bonding from the same side (upper side) simultaneously, or without turning the lead frame over as in the conventional case. Thus, the manufacturing cost can be decreased. Since the lead frame need not be turned over during the manufacturing process, wire deformation does not occur during conveyance of the lead frame, and the yield as the semiconductor device 20 can be improved.

According to the second to fourth embodiments of the present invention, since the upper surface of the second chip 26 has an LOC structure, the interconnection in the package that connects the first and second chips 24 and 26 to each other can be formed without using TAB tapes, and the cost of the lead frame can accordingly be decreased.

According to the semiconductor device lead frame described in the third embodiment, the adhesive tapes 31 are adhered to the lower surfaces of the tab portions 35a extending from the die pad 22, and thereafter the peripheral portion of the die pad 22 is cut, so that the tab portions 35a and die pad 22 are separated from each other, thereby forming the inner leads 35 for interconnection in the package that are independent of each other. Therefore, no TAB tapes need be used, and the manufacturing cost of the lead frame can be decreased.

According to the semiconductor device lead frame described above in the third embodiment, since the hanging pins 30 and the adhesive tapes 31 that adhere the inner leads 35 for interconnection in the package are adhered to each other, a lead frame in which the inner leads 35 for interconnection in the package are completely independent of each other can be formed.

The adhesive tapes 31 such as the LOC tapes are adhered also to the lower surfaces of portions, of the hanging pins 30 supporting the die pad 22, that overlap the second chip 26. As a result, the second chip 26 and the hanging pins 30 are prevented from coming into contact with each other.

The present invention is not limited to the structures described in the above embodiments, and the shapes, structures, and the like of the respective portions can be modified and changed as required, as a matter of course.

For example, the embodiments described above show examples of the structure of the semiconductor device 20 to which the present invention is applied, and the shapes and structures of the respective portions of the semiconductor device 20 can be changed as required. In fine, when the plurality of semiconductor chips 24 and 26 having different chip sizes are to be incorporated in the resin-encapsulated package 20a by fixing them on the two surfaces of the die pad 22, it suffices if the semiconductor chips 24 and 26 can be fixed from one side of the die pad 22, and if the chips 24 and 26 can be connected to the inner leads 27 by bonding through the bonding wires 28 and 29 from one side of the die pad 22.

As has been described above, with the semiconductor device and the method of manufacturing the same according to the present invention, the surface of the second chip is adhered through the adhesive tape such as the LOC tape adhered to the lower surface of the die pad. The first and second chips can be connected by bonding from the same side simultaneously, or without turning the lead frame over as in the conventional case. Thus, the manufacturing process can be simplified, and the manufacturing cost can be decreased. According to the present invention, since the lead frame need not be turned over during the manufacturing process, inconveniences such as wire deformation do not occur during operation. As a result, the product quality of the semiconductor device is improved, and the yield is improved.

According to the present invention, since the upper surface of the second chip has an LOC structure, the interconnection in the package that connects the first and second chips to each other can be formed without using TAB tapes unlike in the conventional case, and the manufacturing cost of the lead frame can accordingly be decreased.

According to the present invention, the semiconductor device can be manufactured by using the conventionally used manufacturing apparatus unchanged.

According to the semiconductor device lead frame of the present invention, the adhesive tapes are adhered to the lower surfaces of the tab portions extending from the die pad, and thereafter the peripheral portion of the die pad is cut, so that the tab portions and die pad are separated from each other, thereby forming the inner leads for interconnection in the package that are independent of each other. Therefore, no TAB tapes need be used, and the cost of the lead frame can be decreased.

According to the present invention, since the adhesive tapes that adhere the hanging pins and the inner leads for interconnection in the package are used, a lead frame in which the inner leads for interconnection in the package are completely independent of each other can be formed.

The adhesive tapes such as the LOC tapes are adhered also to the lower surfaces of portions, of the hanging pins supporting the die pad, that overlap the second chip. As a result, the second chip and the hanging pins are prevented from coming into contact with each other.

What is claimed is:

1. A semiconductor device in which semiconductor chips are mounted on two surfaces of a die pad, a lower one of said semiconductor chips having a portion projecting outward from an upper one of said semiconductor chips, and said semiconductor chips being connected to integrally molded external connection leads through wiring members, wherein said lower semiconductor chip has, on an upper surface thereof, and said upper semiconductor chip has, on an upper surface thereof, pads to be connected to said external connection leads and the lower chip is adhered to a lower surface of the die pad through an adhesive tape and the upper chip is adhered to an upper surface of the die pad through an adhesive paste.

2. A chip stack type semiconductor device having at least two semiconductor chips having different sizes and a die pad on which said semiconductor chips are respectively mounted on upper and lower surfaces thereof, said semiconductor device comprising:

a first semiconductor chip adhered to said upper surface of said die pad through a conductive adhesive;

a second semiconductor chip adhered to said lower surface of said die pad and larger than said first semiconductor chip; and inner leads for connecting said upper surface of said first semiconductor chip and an upper surface of a peripheral portion of said second semiconductor chip by bonding, the second chip is adhered to the lower surface of the die pad through an adhesive tape and the first chip is adhered to the upper surface of the die pad through an adhesive paste.

3. A device according to claim 2, wherein said inner leads are adhered to said peripheral portion of said upper surface of said second semiconductor chip, extending laterally from said die pad and said first semiconductor chip, through adhesive tapes.

4. A device according to claim 3, wherein tab portions extending laterally from said die pad are adhered to said upper surface of said second semiconductor chip through said adhesive tapes adhered to said peripheral portion of said die pad, and said tab portions are connected to pads of said first and second semiconductor chips by bonding to form part of a package internal interconnection.

5. A device according to claim 2, wherein said device further comprises hanging pins for supporting said die pad, and adhesive tapes are adhered to lower surfaces of portions of said hanging pins that overlap said second semiconductor chip, thereby adhering said hanging pins and said second semiconductor chip to each other.

6. A device according to claim 3, wherein package internal interconnection inner leads are adhered through adhesive tapes to a portion of said upper surface of said first semiconductor chip that corresponds to a peripheral portion of said die pad to be independent of each other, and said hanging pins connected to an outer frame of a lead frame are adhered to said upper surface of said second semiconductor chip through said adhesive tapes that adhere said package internal interconnection inner leads.

7. A chip stack type semiconductor device lead frame having a first chip adhered to an upper surface of a die pad through a conductive adhesive, and a second chip adhered to a lower surface of said die pad through an adhesive tape, wherein said device comprises package internal interconnection inner leads adhered to a peripheral portion of said die pad through adhesive tapes to be independent of each other, and said adhesive tapes that adhere said package internal interconnection inner leads are fixed by being adhered to hanging pins connected to a lead frame outer frame.

8. A semiconductor device in which semiconductor chips are mounted on two surfaces of a die pad, a lower one of said semiconductor chips having a portion projecting outward from an upper one of said semiconductor chips, and said semiconductor chips being connected to integrally molded external connection leads through wiring members, wherein said lower semiconductor chip having said outwardly projecting portion has, on a surface thereof on the same side as an upper surface of said upper semiconductor chip, pads to be connected to said external connection leads and the lower chip is adhered to a lower surface of the die pad through an adhesive tape and the upper chip is adhered to an upper surface of the die pad through an adhesive paste, and wherein the size of the lower chip is larger than the size of the die pad.

9. A semiconductor device in which semiconductor chips are mounted on two surfaces of a die pad, a lower one of said semiconductor chips having a portion projecting outward from an upper one of said semiconductor chips, and said semiconductor chips being connected to integrally molded external connection leads through wiring members, wherein said lower semiconductor chip having said outwardly projecting portion has, on a surface thereof on the same side as an upper surface of said upper semiconductor chip, pads to be connected to said external connection leads and the lower chip is adhered to a lower surface of the die pad through an adhesive tape and the upper chip is adhered to an upper surface of the die pad through an adhesive paste, and further comprising a plurality of hanging pins for supporting said die pad wherein at least one hanging pin of said plurality of hanging pins overlaps the lower semiconductor chip by at least 0.6 mm.

10. A device according to claim 2, further comprising a plurality of hanging pins supporting said die paid wherein at least one hanging pin of said plurality of hanging pins overlaps the semiconductor chip by at least 0.6 mm.

* * * * *